United States Patent
Lee et al.

(10) Patent No.: US 9,869,018 B2
(45) Date of Patent: Jan. 16, 2018

(54) SOLID PRECURSOR DELIVERY METHOD USING LIQUID SOLVENT FOR THIN FILM DEPOSITION

(71) Applicant: Taiwan Semiconductor Manufacturing Co., Ltd., Hsin-Chu (TW)

(72) Inventors: Chung-Chieh Lee, Taipei (TW); Chi-Ming Yang, Hsinchu (TW); Lin-Jung Wu, Miaoli (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/138,473

(22) Filed: Apr. 26, 2016

(65) Prior Publication Data

US 2017/0306485 A1   Oct. 26, 2017

(51) Int. Cl.
| | |
|---|---|
| C23C 16/48 | (2006.01) |
| C23C 16/448 | (2006.01) |
| C23C 16/44 | (2006.01) |
| C23C 16/40 | (2006.01) |

(52) U.S. Cl.
CPC ...... *C23C 16/4482* (2013.01); *C23C 16/4402* (2013.01); *C23C 16/405* (2013.01)

(58) Field of Classification Search
CPC .................. C23C 16/4482; C23C 16/4409
See application file for complete search history.

(56) References Cited

U.S. PATENT DOCUMENTS

| | | | | |
|---|---|---|---|---|
| 5,986,020 A * | 11/1999 | Campbell | ............ | B01J 19/2465 526/335 |
| 6,281,022 B1 * | 8/2001 | Li | ........... | C23C 16/40 257/E21.009 |
| 7,597,758 B2 * | 10/2009 | Chen | ........... | C23C 16/18 117/201 |
| 8,146,896 B2 * | 4/2012 | Cuvalci | ........... | C23C 16/4482 261/121.1 |
| 9,090,964 B2 † | 7/2015 | Blackwell et al. | | |
| 2002/0097549 A1 * | 7/2002 | Maletin | ........... | H01M 4/583 361/502 |
| 2007/0235085 A1 * | 10/2007 | Nakashima | ........... | C23C 16/4408 137/240 |
| 2009/0232986 A1 * | 9/2009 | Choi | ........... | C23C 16/45561 427/255.28 |

(Continued)

OTHER PUBLICATIONS

Cuna, A., et al., "Growth of bismuth tri-iodide platelets by the physical vapor deposition method." Cryst. Res. Technol. 39, No. 10, 912-919 (2004).*

(Continued)

*Primary Examiner* — Bret Chen
(74) *Attorney, Agent, or Firm* — Eschweiler & Potashnik, LLC

(57) ABSTRACT

A method of solid precursor delivery for a vapor deposition process is provided. In some embodiments, a precursor ampoule is provided including a solid precursor arranged in the precursor ampoule. A solvent is added to the precursor ampoule including one or more ionic liquids to dissolve chemical species of the solid precursor and to form a liquid precursor. A carrier gas is applied into the liquid precursor through an inlet of the precursor ampoule. A gas precursor is generated at an upper region of the precursor ampoule by vaporization of the liquid precursor. The chemical species of the solid precursor are delivered into a vapor deposition chamber by the carrier gas. The chemical species of the solid precursor is deposited onto a substrate within the vapor deposition chamber.

20 Claims, 3 Drawing Sheets

(56) References Cited

U.S. PATENT DOCUMENTS

| | | | | |
|---|---|---|---|---|
| 2010/0255198 A1* | 10/2010 | Cleary | ............... | C23C 16/4402 |
| | | | | 427/255.39 |
| 2013/0019960 A1* | 1/2013 | Choi | .................. | C23C 16/4481 |
| | | | | 137/334 |
| 2013/0288154 A1* | 10/2013 | Monden | .............. | H01M 4/9008 |
| | | | | 429/482 |
| 2017/0062210 A1* | 3/2017 | Visser | .............. | H01L 21/02271 |

OTHER PUBLICATIONS

Muthukumarasamy, N., et al., "Photoconductive Properties of Hot Wall Deposited CdSe0.7Te0.3 Thin Films". Journal of New Materials for Electrochemical Systems 10, 39-42 (2007).*

Namikawa, Yasuo, et al., "ZnSe Single Crystals Grown by Vapor Growth Methods and Their Applications". SEI Technical Review, No. 72, Apr. 2011, pp. 25-33.*

Sankar, R., et al., "Large single crystal growth, transport property, and spectroscopic characterizations of three-dimensional Dirac semimetal Cd3As2". Scientific Reports, 5:12966, Aug. 14, 2015, pp. 1-10.*

Joshi, et al. "Recent Advances of Ionic Liquids in Separation Science and Mass Spectrometry." RSC Advances, 2012, 2, 5470-5484. Published on Mar. 23, 2012.†

Radu Research Group at Keele University. "Projects: Adaptable Sensors & Real-Life Application of Ionophore-Based Sensors," Publication date is unknown. Retrieved on Oct. 12, 2016 at https://raduresearchgroup.wordpress.com/about/projects/.†

\* cited by examiner
† cited by third party

SOLID PRECURSOR DELIVERY METHOD USING LIQUID SOLVENT FOR THIN FILM DEPOSITION

BACKGROUND

In the fabrication of integrated circuits, vapor deposition is one process used to form thin layers or films over a substrate. The term "vapor deposition" includes physical vapor deposition (PVD), chemical vapor deposition (CVD), or the combination of CVD and PVD (so-called "hybrid" physical-chemical vapor deposition). In a vapor deposition process, the substrate is exposed to a precursor gas, which deposits at the surface of the substrate or reacts at the surface of the substrate and deposits a product of the reaction thereon.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
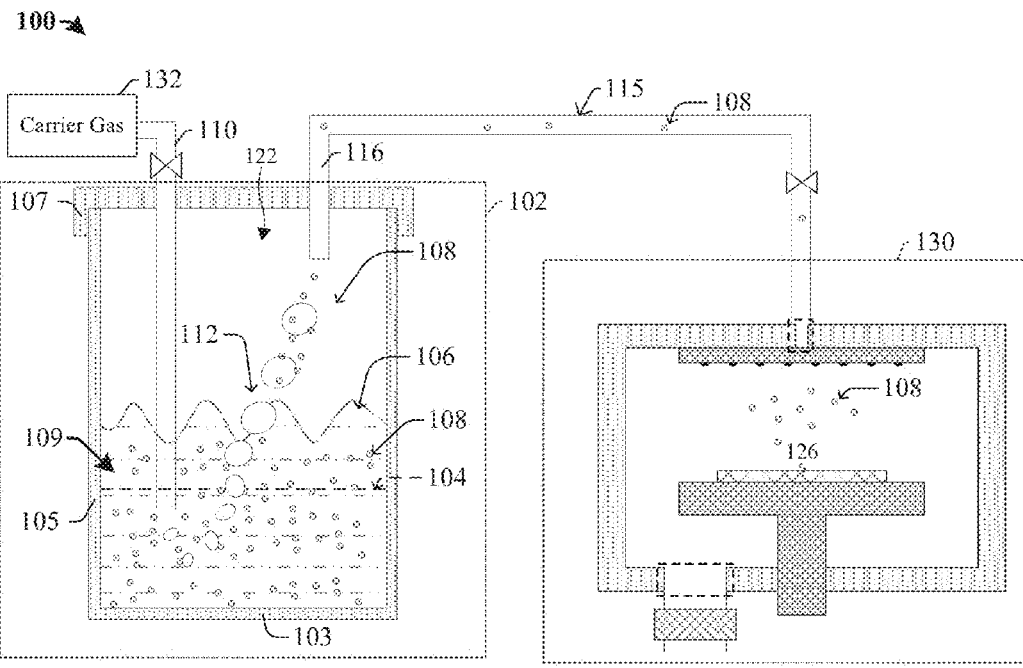
FIG. 1 illustrates a cross-sectional view of some embodiments of a gas precursor generation system for a vapor deposition.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In vapor deposition, a substrate is exposed to a precursor gas, which deposits on a surface of the substrate or which reacts with the substrate surface to deposit a product of the reaction on the substrate surface. One way of forming the precursor gas is to use a solid precursor, which contains chemical species to be deposited on the substrate surface. A stream of carrier gas, which may contain one or more inert gases for example, is directed towards the solid precursor. Upon making contact with the solid precursor, the carrier gas combines with chemical species which are sublimated from the solid precursor, thereby generating a precursor gas stream. The precursor gas stream carries the chemical species from the solid precursor and ultimately deposits them on the substrate to build up the film of deposited material.

Unfortunately, there are some shortcomings of using solid precursors in vapor deposition. First, the materials from which solid precursors are formed typically have low vapor pressures, and as such it is difficult to supply the precursor gas stream at a constant flow rate. The solid precursor may also be degraded, may melt, and/or may aggregate (e.g., "clump") as the deposition process goes on (e.g., when the solid precursor is heated to a temperature near its melting point). Aggregation of the solid precursor greatly reduces sublimation and vaporization rates of the solid precursor, and results in the solid precursor being expended (e.g., wasted) before the solid precursor is entirely consumed. Also, the carrier gas stream may inadvertently carry small traces of powder from the environment near the solid precursor into the vapor deposition chamber, which can lead to particle defects in the films formed on the substrate.

The present disclosure relates to a gas precursor generation system for a vapor deposition process and associated methods. Rather than using a stream of carrier gas to pick-up chemical species directly from a solid precursor, some aspects of this disclosure use a precursor ampoule in which a solid precursor is at least partially submerged beneath a solvent that includes one or more ionic liquids. Thus, the solid precursor is dissolved by the solvent, and chemical species are then carried away by the carrier gas after being dissolved from the solid precursor. This improves delivery of the chemical species to the substrate and forms better quality films than other approaches. Since the ionic liquids dissolve the solid precursor to a liquid phase, the flow rates of the generated precursor gas are more constant than in approaches where the solid precursor is sublimated. Further, because the ionic liquid tends to "catch" powders and other particulates, particle defects of the deposited thin films are reduced and/or eliminated. Also, aggregation problems of solid precursors and usage rates of the solid precursors are improved.

FIG. 1 illustrates a cross-sectional view of a vapor deposition system which includes a gas precursor generation system 100 according to some embodiments. In some embodiments, the gas precursor generation system 100 comprises a precursor ampoule 102 and a vapor deposition chamber 130. The precursor ampoule 102 retains a solid precursor 104, which is fully or partially submerged under a liquid solvent 106. As explained in more detail below, chemical species 108, which are dissolved from the solid precursor 104 by the liquid solvent 106, are passed through a liquid transfer assembly 115 to the vapor deposition chamber 130 and ultimately deposited on or reacted with a substrate 126 (e.g., a wafer) to form a film on the surface of the substrate 126. Among other features, the presence of the liquid solvent 106 provides for homogeneous delivery of the chemical species to the substrate 126.

The precursor ampoule 102 retains liquid solvent 106 which is configured to dissolve the chemical species 108 from the solid precursor 104. The precursor ampoule 102 includes a vacuum-sealed body (which in the illustrated example includes base 103, sidewalls 105, and lid 107), which acts as a storage area to store liquid solvent 106 and to retain solid precursor 104. As the liquid solvent 106 contains dissolved chemical species 108, liquid solvent may be referred to as a liquid precursor 109. In some embodiments, during deposition, the solid precursor 104 is completely dissolved by the solvent 106, while in other embodiments an undissolved portion of the solid precursor 104 is dispersed in the precursor ampoule 102 (e.g., the solid precursor 104 is partially dissolved by the solvent 106). The undissolved portion may decrease as the process continues.

A carrier gas 112, such as one or more inert gases provided by carrier gas source 132, is provided into the liquid precursor 109 through inlet 110 of the precursor ampoule 102, and bubbles up through the liquid solvent 106. A gas precursor, for example, a gas mixture containing the chemical species 108, is then generated at an upper region 122 of the precursor ampoule 102 by vaporization of the liquid precursor 109. The gas precursor is carried by the carrier gas 112 through the outlet 116 of the precursor ampoule 102. The chemical species 108 are delivered into the vapor deposition chamber 130 by the liquid transfer assembly 115 and are deposited at an exposed surface of substrate 126. In some embodiments, the chemical species 108 react or are chemically bound (e.g., chemisorbed) at the exposed surface of the substrate 126, and a deposited film comprises a product of the reaction. In some embodiments, a first layer of the chemical species 108, such as a monolayer, is formed on the substrate 126 first. Then a second reaction gas is applied onto the deposited film to react with the first layer to form a first compound layer. For example, in some embodiments, the first compound layer can comprise a single homogenous layer that corresponds to an oxidized version of the first layer. The chemical species 108 can then be supplied a second time to form another first layer over the first compound layer, and the second reaction gas can then be re-applied to form a second compound layer. Additional compound layers (e.g., a third compound layer, fourth compound layer, etc.) can be built up over the second compound layer by iteratively repeating these steps.

In some embodiments, the carrier gas 112 can comprise inert or non-active gases such as helium (He), argon (Ar), nitrogen ($N_2$) or hydrogen ($H_2$). In some embodiments, the carrier gas 112 can also be used as a purge gas after the deposition process. For example, excessive gas precursor is carried out from the vapor deposition chamber 130 by the purge gas. In some embodiments, the solid precursor 104 may comprise precursors for depositing dielectric films (e.g. $SiO_2$, SiN, $HfO_2$, $ZrO_2$, $La_2O_3$) or metal films (e.g. TiN, TaN, TiAl, TaAl, Ni, Cu, Al, W). The solid precursor 104 comprises one or more high-melting point solid materials. The solvent 106 may comprise ionic liquids that dissolve the solid precursor 104. In some embodiments, the solvent 106 has a low vapor pressure, smaller than $10^{-8}$ pascal (Pa) at room temperature for example, and a high decomposition temperature, greater than 100 Celsius (° C.) for example, such that little of the solvent 106 would be carried to the vapor deposition chamber 130 during the deposition process. The solvent 106 may have a freezing point less than 30 Celsius (° C.) such that low temperature-operation can be achieved.

As an example, hafnium oxide ($HfO_2$) films can be formed onto the upper surface of the substrate 126 using the solid precursor 104. The solid precursor 104 may comprise hafnium tetrachloride ($HfCl_4$) including hafnium and chlorine as the chemical species 108. $HfCl_4$ is dissolved in the solvent 106. The dissolved $HfCl_4$ is then vaporized and raised towards an upper region of the precursor ampoule 102. $HfCl_4$ is then carried to the vapor deposition chamber 130 in a gas phase pulse by the carrier gas 112 for the vapor deposition process. Hafnium atoms are chemically bound (e.g., chemisorbed) onto an upper surface of the substrate 126 within the vapor deposition chamber 130. In some embodiments, a monolayer or at least a very thin layer (thickness in angstrom or nanometer scale) of hafnium and chlorine atoms is formed on the upper surface of the substrate 126. The hafnium and chlorine atoms may be bonded to a dielectric or conductive layer having a saturated surface as a result of self-terminating reaction. After forming the hafnium chloride layer, a first pulse of the purge gas may be applied to remove excessive $HfCl_4$ precursor gas within the vapor deposition chamber 130. A second reaction gas, such as a pulse of $H_2O$ gas is applied onto the formed hafnium chloride layer and is chemically bound to the hafnium chloride layer to form a thin layer of hafnium oxide ($HfO_2$). Excessive $H_2O$ gas can be removed by a second pulse of the purge gas. In some embodiments, this process can be repeated to achieve desired deposition thicknesses.

In some embodiments, the solvent 106 may comprise non-coordinating anions that interact weakly with cations to prevent complex formation with the chemical species 108. Examples of those anions include 1-butyl-3-methylimidazolium hexafluorophosphate (BmimPF6) or 1-ethyl-3-methylimidazolium tetrafluoroborate (EmimBF4). In some other embodiments, the solid precursor 104 may comprise zirconium tetrachloride (ZrCl4), hafnium tetraiodide (HfI4), PDMAT, tungsten chloride, $C_{10}H_{10}Ni$, or $C_{22}H_{38}NiO_4$. In some embodiments, anions of the ionic liquids may comprise hexafluorophosphate, tetrafluoroborate, trifluoromethylsulfonate, bis[(trifloromethyl)sulfonyl]amide, trifluoroethanoate, ethanoate,or halide. In some alternative embodiments, cations of the ionic liquids comprise 1-alkyl-3-methylimidazolium, n-alkylpyridinium, tetraalkylammonium, tetraalkylphosphonium, or pyrrolidinium.

Figure 2:
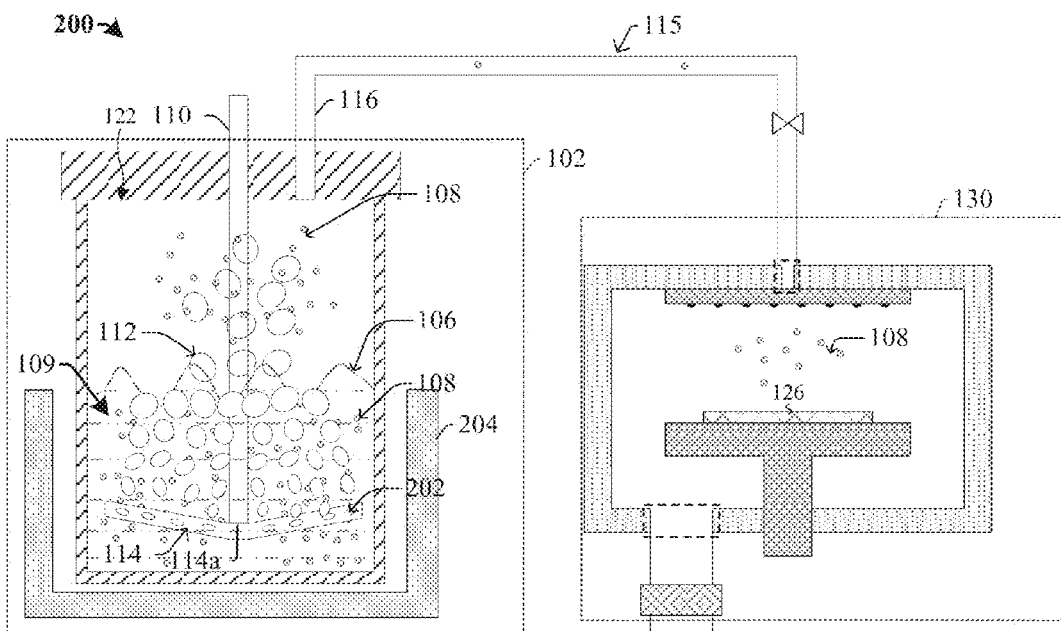
FIG. 2 illustrates a cross-sectional view of some other embodiments of a gas precursor generation system for a vapor deposition process.

FIG. 2 illustrates a cross-sectional view of a gas precursor generation system 200 for a vapor deposition process according to some alternative embodiments. In some embodiments, the gas precursor generation system 200 comprises a precursor ampoule 102 including an inlet 110 coupled with a carrier gas source 132 and an outlet 116 coupled with a vapor deposition chamber 130. The inlet 110 is connected to a diffuser 114, which is a hollow, tube-like structure. An interior cavity of the diffuser 114 is in fluid communication with the inlet 110. From a point 114a where the diffuser 114 meets the inlet 110, the tube of the diffuser 114 can be angled upwardly as it extends away from the point 114a. The tube of the diffuser 114 includes a plurality of holes 202 through which carrier gas can pass from the inlet 110 into a liquid precursor 109 within the precursor ampoule 102. In some embodiments, the liquid precursor 109 comprises a solvent 106 and chemical species 108 dissolved therein. In some embodiments, a solid precursor comprises the chemical species 108 and may be dissolved by the solvent 106 during the deposition process. A carrier gas 112 is provided into the liquid precursor 109 through the inlet 110 of the precursor ampoule 102 and the diffuser 114, and is pushed out from the plurality of holes 202. By using the diffuser 114, the carrier gas 112 is uniformly dispensed and facilitates vaporization of the chemical species 108 from the solid precursor 104 and carries the chemical species 108 to an upper region 122 of the vapor deposition chamber 130. In some embodiments, a stirring device 204 is arranged within or around the precursor ampoule 102. The stirring device 204 is configured to facilitate dissolution of the solid precursor and/or improve vaporization efficiency of the chemical species 108. The stirring device 204 can also be an ultrasonic or megasonic device. In some embodiments, the stirring device 204 can also be a mechanical stirring device set in the precursor ampoule 102.

Figure 3:
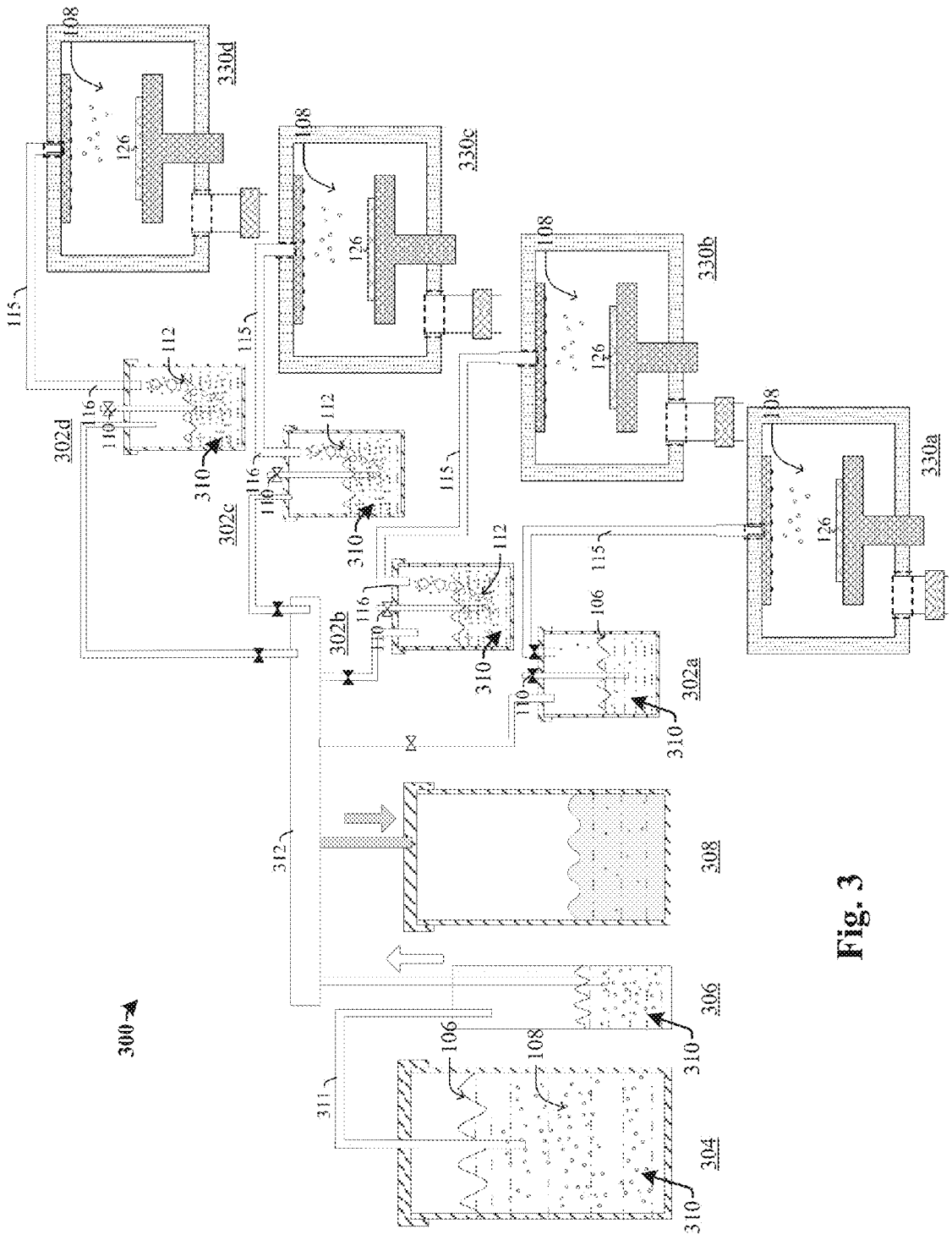
FIG. 3 illustrates a diagram of some other embodiments of a gas precursor generation system for a vapor deposition process including a bulk canister and a plurality of precursor ampoules.

FIG. 3 illustrates a diagram of a gas precursor generation system 300 for a vapor deposition process including a bulk canister and a plurality of precursor ampoules according to some embodiments. The system includes a bulk canister 304 and a buffer canister 306, which provide liquid solvent 106 to a plurality of precursor ampoules 302a, 302b, 302c, 302d, etc. The precursor ampoules (302a, 302b, 302c, 302d, . . . , respectively) are coupled to vapor deposition chambers (330a, 330b, 330c, 330d, . . . , respectively) in which wafers or other substrates are separately housed and processed. Vapor depositions can occur concurrently for substrates 126 in the various vapor deposition chambers. The bulk canister 304, which has a first volume, retains a liquid precursor 310 including a liquid solvent 106 and chemical species 108 dissolved therein at a pre-determined concentration. The buffer canister 306 is connected to the bulk canister 304 and has a second volume, which is smaller than the first volume. In some embodiments, the first volume of the bulk canister 304 may be around tens of times the second volume of the buffer canister 306.

During the deposition process, the solvent 106 and the chemical species 108 are initially transferred to the buffer canister 306 from the bulk canister 304 though a first liquid transfer assembly 311, and are subsequently delivered to the plurality of precursor ampoules 302a, 302b, 302c and 302d through a second liquid transfer assembly 312. The buffer canister 306 temporarily holds a certain amount of the liquid precursor 310 such that the bulk canister 304 can be replaced without interrupting the vapor deposition process. A carrier gas 112 is applied into the liquid precursor through the inlets 110 of the precursor ampoules 302a, 302b, 302c, and carries the chemical species 108 to the vapor deposition chambers 330a, 330b, 330c, 330d in gas phase through gas transfer assemblies 115. The chemical species 108 ultimately deposit on or react with the substrates 126 to form a film on the surface of the substrates 126.

As the deposition process continues, the chemical species 108 of the precursor ampoule 302a can be consumed so that the concentration of the chemical species 108 in the precursor ampoule 302a reaches a critical level where the liquid precursor 310 needs to be replaced. In some embodiments, the outlet 116 of the precursor ampoule 302a is turned off, used liquid precursor including the solvent 106 and any remaining chemical species 108 is pumped to a waste tank 308 for recycling, and new liquid precursor 310 is directed to the precursor ampoule 302a from the buffer canister 306. The used solvent is recycled to the waste tank 308 through the liquid transfer assembly 312 or another separate liquid transfer assembly. The used solvent is recycled to the waste tank 308 that is coupled to the precursor ampoules 302a, 302b, 302c and 302d during and/or after the vapor deposition process.

Figure 4:
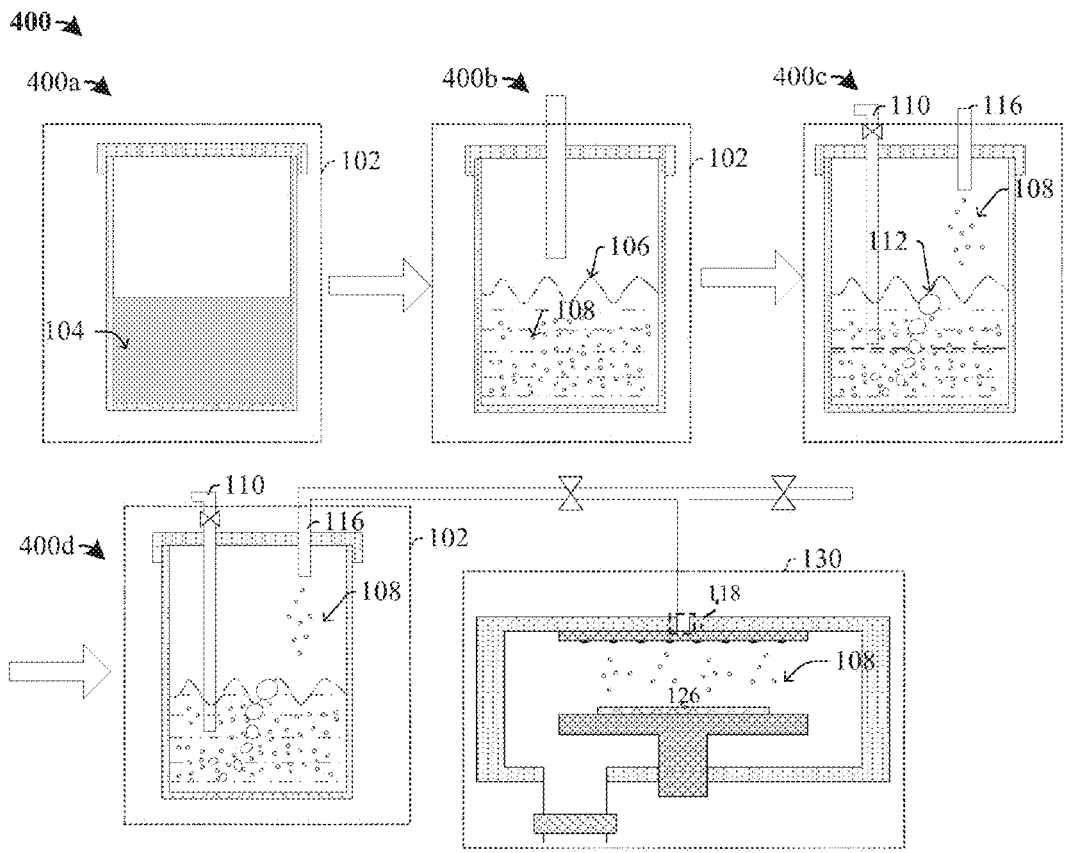
FIG. 4 illustrates a diagram of some embodiments of a method of solid precursor delivery for a vapor deposition process.

FIG. 4 illustrates a diagram including a series of cross-sectional views 400a-400d of a method of solid precursor delivery for a vapor deposition process according to some embodiments.

As shown in cross-sectional view 400a, a solid precursor 104 is provided within a precursor ampoule 102. In some embodiments, the precursor ampoule 102 can be a bubbler with the solid precursor 104 arranged in the bubbler. The solid precursor 104 may comprise precursor molecules for depositing dielectric films (e.g. $SiO_2$, SiN, $HfO_2$, $ZrO_2$, $La_2O_3$) or metal films (e.g. TiN, TaN, TiAl, TaAl, Ni, Cu, Al, W). In some embodiments, the solid precursor 104 may comprise a high-k dielectric precursor, such as hafnium tetrachloride ($HfCl_4$), zirconium tetrachloride (ZrCl4), or hafnium tetraiodide (HfI4). In some other embodiments, the solid precursor 104 may comprise a metal precursor, such as PDMAT, tungsten chloride, $C_{10}H_{10}Ni$, or $C_{22}H_{38}NiO_4$.

As shown in cross-sectional view 400b, a solvent 106 including one or more ionic liquids is added into the precursor ampoule 102. The solvent 106 is configured to dissolve the solid precursor 104. In some embodiments, the solid precursor 104 is completely dissolved to form a liquid precursor, and solid precursor molecules are subsequently absent from the precursor ampoule 102. In some other embodiments, the solid precursor 104 is not completely dissolved by the solvent 106, and a remaining portion of the solid precursor 104 is dispersed into the solvent 106.

During the vapor deposition process, the precursor ampoule 102 may be kept at a temperature which is lower than a melting point of the solid precursor 104. Low vapor pressure and high thermal stability are preferred when choosing the solvent 106 such that the solvent 106 is not carried to the vapor deposition chamber 130 or decomposed during the deposition process. In some embodiments, the solvent 106 has a vapor pressure smaller than $10^{-8}$ pascal (Pa) at room temperature, and a decomposition temperature greater than 100 Celsius (° C.). The solvent 106 may have a freezing point that is less than 30 Celsius (° C.) such that low-temperature operation can be achieved. In some embodiments, the solvent 106 may comprise non-coordinating anions that interact weakly with cations to prevent complex formation with the solid precursor 104. Examples of those anions includel-butyl-3-methylimidazolium hexafluorophosphate (BmimPF6) or 1-ethyl-3-methylimidazolium tetrafluoroborate (EmimBF4). In some embodiments, anions of the ionic liquids may comprise hexafluorophosphate, tetrafluoroborate, trifluoromethylsulfonate, bis [(trifloromethyl)sulfonyl]amide, trifluoroethanoate, ethanoate, or halide. In some embodiments, cations of the ionic liquids comprise 1-alkyl-3-methylimidazolium, n-alkylpyridinium, tetraalkylammonium, tetraalkylphosphonium, or pyrrolidinium.

As shown in cross-sectional view 400c, the solid precursor 104 dissolved in the solvent 106 is vaporized, with a vaporization rate greater than the solvent 106. A carrier gas 112 is applied into the liquid precursor and facilitates gas precursor generation. A gas precursor, which includes chemical species 108 to be deposited on a substrate, is vaporized from the liquid precursor and is gathered at an upper region of the precursor ampoule 102.

As shown in cross-sectional view 400d, the gas precursor including chemical species 108 from the solid precursor is carried to a vapor deposition chamber 130 by the carrier gas 112 from an outlet 116 of the precursor ampoule 102. The chemical species 108 are deposited onto an upper surface of a substrate 126. In some embodiments, a thin layer of the chemical species 108 is first chemically boned (e.g., chemisorbed) onto an exposed surface of the substrate 126. Next, additional reaction gases are supplied to form thin layers over the chemisorbed thin layer of chemical species. Supplies of the reaction gases can be controlled by a flow controller such as a proportional valve, needle valve, regulator or mass flow controller. In some embodiments, the formed thin layers are selectively removed by performing a photolithography process that patterns a masking layer (e.g., a photoresist mask) to protect some regions from one or more subsequent etching processes. In various embodiments, the etching processes may comprise a wet etch and/or a dry etch (e.g., a plasma etch with tetrafluoromethane ($CF_4$), sulfur hexafluoride ($SF_6$), nitrogen trifluoride ($NF_3$), etc.).

Figure 5:
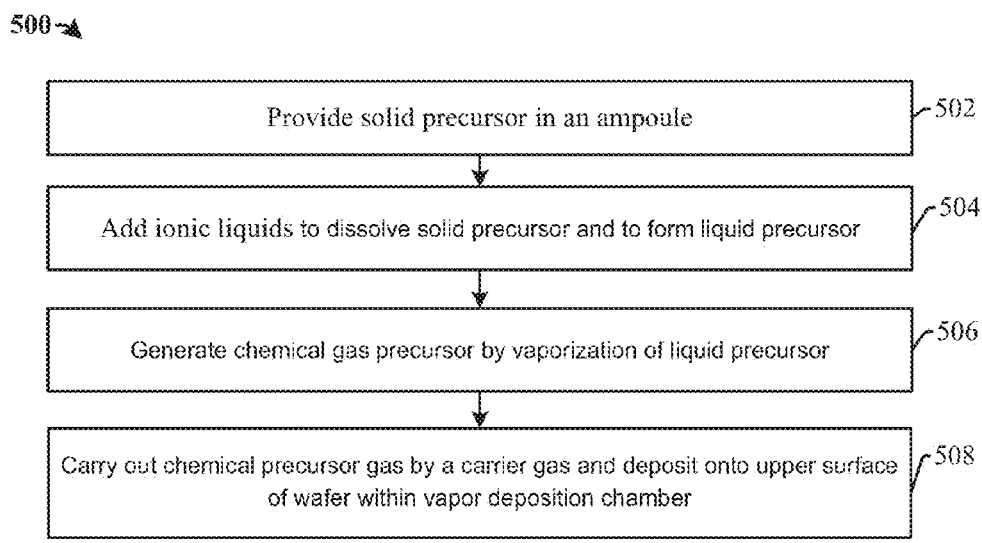
FIG. 5 illustrates a flow diagram of some embodiments of a method of solid precursor delivery for a vapor deposition process.

FIG. 5 illustrates a flow diagram of a method 500 of solid precursor delivery for a vapor deposition process according to some embodiments. Although method 500 is described in relation to FIG. 4, it will be appreciated that the method 500 is not limited to such structures, but instead may stand alone as a method independent of the structures. Furthermore, while the disclosed methods (e.g., method 500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases and may be repeated.

At 502, a solid precursor is provided within a precursor ampoule. In some embodiments, the precursor ampoule can be a bubbler having the solid precursor 104 arranged therein. The solid precursor may comprise precursor molecules for depositing dielectric films or metal films. Cross-sectional view 400a of FIG. 4 illustrates some embodiments corresponding to act 502.

At 504, a solvent including one or more ionic liquids is added into the precursor ampoule to dissolve the solid precursor. In some embodiments, the solid precursor is completely dissolved to form a liquid precursor, and solid precursor molecules are absent from the precursor ampoule. A low vapor pressure and high thermal stability are preferred when choosing the solvent such that little solvent would be carried to a vapor deposition chamber or be decomposed during the vapor deposition process. In some embodiments, the solvent has a vapor pressure smaller than $10^{-8}$ pascal (Pa) at room temperature, and a decomposition temperature greater than 100 Celsius (° C.). The solvent may have a freezing point smaller than 30 Celsius (° C.). In some embodiments, the solvent may comprise non-coordinating anions that interact weakly with cations to prevent complex formation with the solid precursor. Cross-sectional view 400b of FIG. 4 illustrates some embodiments corresponding to act 504.

At 506, a gas precursor, which is vaporized from the liquid precursor, is gathered at an upper region of the precursor ampoule. A carrier gas is applied into the liquid precursor and facilitates gas precursor generation. Cross-sectional view 400c of FIG. 4 illustrates some embodiments corresponding to act 506.

At 508, the gas precursor including chemical species from the solid precursor is carried to a vapor deposition chamber by the carrier gas. The chemical species are deposited onto an exposed surface of a substrate. In some embodiments, a first thin layer of the chemical species is chemisorbed onto a surface of the substrate. Then, after the first thin layer has been chemisorbed, a second reaction gas (e.g. a reaction gas stream including $H_2O$ or $O_2$) is supplied to form a first compound layer with the first thin layer of chemical species (e.g. an oxidation compound of the chemical species). After the first compound layer has been formed, a second thin layer of the chemical species is formed onto the first compound layer and then chemisorbed by another stream of the second reaction gas to form a second compound layer stacked onto the first compound layer. This process can be repeated in order to achieve desired thickness of compound layers. Cross-sectional view 400d of FIG. 4 illustrates some embodiments corresponding to act 508.

Therefore, the present disclosure relates to a gas precursor generation system for a vapor deposition process, and an associated method of generating a gas precursor from a solid precursor within a precursor ampoule. A solvent including one or more ionic liquids is added to a solid precursor within a precursor ampoule to dissolve the solid precursor. Chemical species of the dissolved solid precursor are carried to a vapor deposition chamber and deposited at upper surfaces of a substrate as thin films. By dissolving the solid precursor in liquid phase using the ionic liquids, aggregated problem of the solid precursor is solved and usage rate of the solid precursor is improved.

In some embodiments, the present disclosure relates to a gas precursor generation system for a vapor deposition process. The gas precursor generation system comprises a precursor ampoule including an inlet coupled with a carrier gas source and an outlet coupled with a vapor deposition chamber. The gas precursor generation system further comprises a liquid precursor including ionic liquids and arranged within the precursor ampoule comprising a solvent configured to dissolve chemical species of a solid precursor. The gas precursor generation system further comprises a gas precursor generated at an upper region of the precursor ampoule by vaporization of the liquid precursor and carried to the vapor deposition chamber by a carrier gas through the outlet of the precursor ampoule. The chemical species of the solid precursor are delivered into the vapor deposition chamber and deposited onto a surface of a substrate.

In other embodiments, the present disclosure relates to a method of solid precursor delivery for a vapor deposition process. The method comprises providing a precursor ampoule including a solid precursor arranged in the precursor ampoule and adding a solvent including ionic liquids to the precursor ampoule to dissolve chemical species of the solid precursor and to form a liquid precursor. The method further comprises applying a carrier gas into the liquid precursor through an inlet of the precursor ampoule and generating a gas precursor at an upper region of the precursor ampoule by vaporization of the liquid precursor. The method further comprises carrying the gas precursor to the vapor deposition chamber by the carrier gas through an outlet of the precursor ampoule. The chemical species of the solid precursor are delivered into the vapor deposition chamber. The method further comprises depositing the chemical species of the solid precursor onto a substrate within the vapor deposition chamber.

In yet other embodiments, the present disclosure relates to a method of solid precursor delivery for a vapor deposition process. The method comprises providing a plurality of precursor ampoules, including a liquid precursor arranged therein, the liquid precursor including a ionic liquid solvent and chemical species dissolved therein. The method further comprises providing a bulk canister coupled to the plurality of precursor ampoules, including the liquid precursor retained within the bulk canister and configured to transfer to the precursor ampoules through a buffer canister and a liquid transfer assembly. The method further comprises generating a gas precursor at upper regions of the precursor ampoules by vaporization of the liquid precursor. The method further comprises directing the gas precursor including the chemical species to a plurality of vapor deposition chambers by a carrier gas. The method further comprises depositing the chemical species onto surfaces of substrates within the vapor deposition chambers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of solid precursor delivery for a vapor deposition process, comprising:
    providing a precursor ampoule including a solid precursor arranged in the precursor ampoule;
    adding a solvent including one or more ionic liquids to the precursor ampoule to partially dissolve chemical species of the solid precursor to form a liquid precursor while leaving an undissolved portion of the solid precursor dispersed in the precursor ampoule;
    applying a carrier gas into the liquid precursor through an inlet of the precursor ampoule;
    generating a gas precursor including the partially dissolved chemical species at an upper region of the precursor ampoule by vaporization of the liquid precursor, wherein the undissolved portion of the solid precursor decreases as the vaporization continues;
    carrying the gas precursor to a vapor deposition chamber by the carrier gas through an outlet of the precursor ampoule, wherein the chemical species of the solid precursor are delivered into the vapor deposition chamber; and
    depositing the chemical species of the solid precursor onto a substrate within the vapor deposition chamber.

2. The method of claim 1, wherein the carrier gas is led into a diffuser immersed into the liquid precursor, and is led out through a plurality of holes of the diffuser into the liquid precursor.

3. The method of claim 1, wherein cations of the ionic liquids comprise 1-alkyl-3-methylimidazolium, n-alkylpyridinium, tetraalkylammonium, tetraalkylphosphonium, or pyrrolidinium.

4. The method of claim 1, wherein anions of the ionic liquids comprise hexafluorophosphate, tetrafluoroborate, trifluoromethylsulfonate, bis[(trifloromethyl)sulfonyl]amide, trifluoroethanoate, or ethanoate.

5. The method of claim 1, wherein the solid precursor comprises $HfCl_4$, and the solvent comprises $BmimPF_6$ or $BmimBF_4$.

6. The method of claim 1, wherein the ionic liquids have viscosity smaller than 3000 centipoises (cP).

7. The method of claim 1, wherein the solvent has a freezing point smaller than 30 Celsius (° C.) and a decomposition temperature greater than 100 Celsius (° C.).

8. The method of claim 1, wherein the solvent has a vapor pressure smaller than $10^{-8}$ pascal (Pa) at room temperature.

9. The method of claim 1, wherein the solvent in the precursor ampoule is refilled and recycled through a liquid transfer assembly for a plurality of precursor ampoules.

10. A method of solid precursor delivery for a vapor deposition process, comprising:
    providing a plurality of precursor ampoules, each of which comprising a first inlet for inputting a liquid precursor, a second inlet for applying a carrier gas, and an outlet for outputting a gas precursor, the liquid precursor including a ionic liquid solvent and chemical species dissolved therein;
    providing a bulk canister connected to a buffer canister and coupled to the plurality of precursor ampoules through the first inlets of the plurality of precursor ampoules, the liquid precursor retained within the bulk canister and configured to transfer to the precursor ampoules;
    generating the gas precursor at upper regions of the precursor ampoules by vaporization of the liquid precursor;
    directing the gas precursor including the chemical species through the outlets to a plurality of vapor deposition chambers by the carrier gas; and
    depositing the chemical species onto surfaces of substrates within the vapor deposition chambers.

11. The method of claim 10, further comprising:
    closing the outlet and recycling the liquid precursor within one of the plurality of precursor ampoules to a waste tank when a concentration of the chemical species in the precursor ampoule reaches a pre-determined level; and
    after the recycling, directing the liquid precursor from the buffer canister to the precursor ampoule and opening the outlet to continue the deposition.

12. A method of solid precursor delivery for a vapor deposition process, comprising:
    retaining a liquid precursor within a bulk canister, the liquid precursor including one or more ionic liquids as a solvent that dissolves chemical species of a solid precursor;
    providing the liquid precursor from the bulk canister to a precursor ampoule including an inlet coupled with a carrier gas source and an outlet coupled with a vapor deposition chamber;
    applying a carrier gas through the inlet of the precursor ampoule to create a gas precursor at an upper region of the precursor ampoule by vaporization of the liquid precursor; and
    carrying the gas precursor to the vapor deposition chamber by the carrier gas through the outlet of the precursor ampoule, wherein the chemical species of the solid precursor are delivered into the vapor deposition chamber and deposited onto a surface of a substrate;
    wherein the liquid precursor retained within the bulk canister is continuously provided to the precursor ampoule through a buffer canister, wherein as the liquid precursor is consumed in the precursor ampoule, the bulk canister is replaced without interrupting the vapor deposition process.

13. The method of claim 12, further comprising applying a diffuser to be connected to the inlet of the precursor ampoule, the diffuser including a plurality of holes immersed into the liquid precursor.

14. The method of claim 12, further comprising applying a stirring device into the precursor ampoule, the stirring device configured to facilitate dissolution of the solid precursor.

15. The method of claim 12, further comprising:
applying a waste tank to be coupled to the precursor ampoule, the waste tank configured to recycle the solvent from the precursor ampoule during the vapor deposition process.

16. The method of claim 12, wherein cations of the ionic liquids comprise 1-alkyl-3-methylimidazolium, n-alkylpyridinium, tetraalkylammonium, tetraalkylphosphonium, or pyrrolidinium.

17. The method of claim 12, wherein anions of the ionic liquids comprise hexafluorophosphate, tetrafluoroborate, trifluoromethylsulfonate, bis[(trifloromethyl)sulfonyl]amide, trifluoroethanoate, or ethanoate.

18. The method of claim 12, wherein the solid precursor comprises a metal halide compound, and the solvent comprises $BmimPF_6$ or $BmimBF_4$.

19. The method of claim 12, wherein the solvent has a freezing point smaller than 30 Celsius (° C.) and a decomposition temperatures greater than 100 Celsius (° C.);
wherein the solvent has a vapor pressure smaller than $10^{-8}$ pascal (Pa).

20. The method of claim 12, wherein solid precursor molecules are dissolved and absent from the precursor ampoule when applying the carrier gas.

* * * * *